(12) United States Patent
Tadayon et al.

(10) Patent No.: US 12,313,890 B2
(45) Date of Patent: May 27, 2025

(54) THROUGH-SUBSTRATE OPTICAL VIAS

(71) Applicant: Intel Corporation, Santa Clara, CA (US)

(72) Inventors: Pooya Tadayon, Portland, OR (US); Zhichao Zhang, Chandler, AZ (US); Brandon Marin, Gilbert, AZ (US); Tarek Ibrahim, Mesa, AZ (US); Kemal Aygun, Tempe, AZ (US); Stephen Smith, Laveen, AZ (US)

(73) Assignee: Intel Corporation, Santa Clara, CA (US)

( * ) Notice: Subject to any disclaimer, the term of this patent is extended or adjusted under 35 U.S.C. 154(b) by 833 days.

(21) Appl. No.: 17/349,305

(22) Filed: Jun. 16, 2021

(65) Prior Publication Data

US 2022/0404551 A1 Dec. 22, 2022

(51) Int. Cl.
| | |
|---|---|
| *G02B 6/42* | (2006.01) |
| *G02B 6/12* | (2006.01) |
| *H05K 1/02* | (2006.01) |
| *G02B 6/122* | (2006.01) |

(52) U.S. Cl.
CPC ....... *G02B 6/4204* (2013.01); *G02B 6/12004* (2013.01); *H05K 1/0274* (2013.01); *G02B 6/12019* (2013.01); *G02B 2006/12061* (2013.01); *G02B 2006/1213* (2013.01); *G02B 6/1225* (2013.01)

(58) Field of Classification Search
CPC .. G02B 6/12; G02B 6/12002; G02B 6/12004; H05K 1/0274
See application file for complete search history.

(56) References Cited

U.S. PATENT DOCUMENTS

| | | | | |
|---|---|---|---|---|
| 4,070,516 A | * | 1/1978 | Kaiser | G02B 6/43 |
| | | | | 428/428 |
| 5,200,631 A | * | 4/1993 | Austin | H01L 31/02327 |
| | | | | 257/E31.127 |
| 5,848,214 A | * | 12/1998 | Haas | G02B 6/43 |
| | | | | 385/115 |
| 6,090,636 A | * | 7/2000 | Geusic | G02B 6/032 |
| | | | | 438/456 |

(Continued)

FOREIGN PATENT DOCUMENTS

JP     2002-50735 A   *   2/2002

OTHER PUBLICATIONS

K. Takemura et al. Vertical optical and electrical interconnection for chip-scale-packaged Si photonic transceivers. 2019 International 3D Systems Integration Conference (3DIC), held Oct. 2019 (https://doi.org/10.1109/3DIC48104.2019.9058778) (Year: 2019).*

*Primary Examiner* — Michael Stahl
(74) *Attorney, Agent, or Firm* — Essential Patents Group, LLP (57) ABSTRACT

Integrated circuit packages may be formed having at least one optical via extending from a first surface of a package substrate to an opposing second surface of the package substrate. The at least one optical via creates an optical link between the opposing surfaces of the package substrate that enables the fabrication of a dual-sided optical multiple chip package, wherein integrated circuit devices can be attached to both surfaces of the package substrate for increased package density.

20 Claims, 8 Drawing Sheets

(56) References Cited

U.S. PATENT DOCUMENTS

| | | | | |
|---|---|---|---|---|
| 6,236,786 B1* | 5/2001 | Aoki | G02B 6/43 | 385/14 |
| 6,330,377 B1* | 12/2001 | Kosemura | H04B 10/801 | 385/47 |
| 6,512,861 B2* | 1/2003 | Chakravorty | G02B 6/42 | 385/14 |
| 6,792,179 B2* | 9/2004 | Lu | G02B 6/43 | 385/32 |
| 7,263,248 B2* | 8/2007 | Windover | H05K 1/0274 | 385/39 |
| 7,373,033 B2* | 5/2008 | Lu | G02B 6/4246 | 257/432 |
| 8,265,432 B2* | 9/2012 | Doany | G02B 6/4206 | 257/434 |
| 9,397,024 B2* | 7/2016 | Lee | H01L 23/481 | |
| 10,600,739 B1* | 3/2020 | Herrault | H01L 23/15 | |
| 2002/0048427 A1* | 4/2002 | Chiarulli | G02B 6/43 | 385/39 |
| 2002/0051599 A1* | 5/2002 | Tsukamoto | G02B 6/4214 | 385/14 |
| 2004/0091719 A1* | 5/2004 | Uchida | H05K 1/0274 | 428/457 |
| 2006/0263003 A1* | 11/2006 | Asai | G02B 6/43 | 257/E31.127 |
| 2007/0102777 A1* | 5/2007 | Davuluri | H01S 5/02326 | 257/E31.103 |
| 2010/0067853 A1* | 3/2010 | Kuznia | G02B 6/43 | 385/88 |
| 2012/0142186 A1* | 6/2012 | Shimoi | B23K 26/0006 | 257/E21.586 |
| 2012/0314992 A1* | 12/2012 | Lee | G02B 6/4202 | 385/14 |
| 2013/0322814 A1* | 12/2013 | Lee | H05K 1/0274 | 29/846 |
| 2013/0330035 A1* | 12/2013 | Shin | G02B 6/12 | 385/14 |
| 2014/0270785 A1* | 9/2014 | Kim | H04B 10/801 | 398/115 |
| 2014/0321801 A1* | 10/2014 | Ellis-Monaghan | G02B 6/136 | 385/32 |
| 2014/0321802 A1* | 10/2014 | Ellis-Monaghan | G02B 6/122 | 438/69 |
| 2015/0003841 A1* | 1/2015 | McLaren | G02B 6/43 | 398/141 |
| 2017/0263536 A1* | 9/2017 | Lin | H01L 24/00 | |
| 2019/0096833 A1* | 3/2019 | Lim | H01L 24/19 | |
| 2019/0391325 A1* | 12/2019 | Iida | G02B 6/32 | |

* cited by examiner

THROUGH-SUBSTRATE OPTICAL VIAS

TECHNICAL FIELD

Embodiments of the present description generally relate to the field of integrated circuit assemblies and, more particularly, to the fabrication of optical vias extending through package substrates within the integrated circuit assemblies.

BACKGROUND

The integrated circuit industry is continually striving to produce ever faster and smaller integrated circuit devices for use in various server and mobile electronic products, including, but not limited to, computer server products and portable products, such as wearable integrated circuit systems, portable computers, electronic tablets, cellular phones, digital cameras, and the like.

As these goals are achieved, the integrated circuit devices become smaller. However, communication demands have been increasing considerably faster than scaling (e.g., Moore's law) can achieve. For example, machine intelligence systems are requiring core counts in the thousands, "near compute" memory of greater than 10 gigabytes, connectivity bandwidth of greater than one terabyte per second between multiple nodes, low latency, thermal control, and good manufacturability, as will be understood to those skilled in the art. Of course, signal loss significantly increases with metal conductive routes (used for electrical interconnects) as signaling frequency increases and distance between the integrated circuit devices increases. Furthermore, the routing of the conductive routes becomes increasingly complex as more integrated circuit devices are added to an integrated circuit package. These integrated circuit packages generally have the integrated circuit devices, including, but not limited to, microprocessors, chipsets, graphics devices, wireless devices, memory devices, application specific integrated circuits, transceiver devices, input/output devices, combinations thereof, stacks thereof, or the like, electrically attached to a single side of a package substrate and interconnected with parallel input/output components (e.g. embedded bridges, and the like) or serial input/output components (e.g., serializer/deserializers (serdes), PCIe, and the like). These integrated circuit devices may include at least one photonic integrated circuit device having optical communication cable, such as an optical fiber cable, attached thereto, to form high speed connection to components external to the integrated circuit package.

Using parallel input/output components, such as embedded bridges based on multi-die input/output (MDIO) configuration, to connect integrated circuit devices on a single side of the package substrate has a reach concern, as the size of these integrated circuit packages grow. Using serial input/output components, such as serdes or PCIe configurations, to connect integrated circuit devices on a single side of the package substrate has concerns with regard to power efficiency scaling to meet bandwidth growth needs and thermal limitations, as will be understood to those skilled in the art.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

For the purposes of the present description, the terms 'lens' and 'lens assembly' are defined herein to include any appropriate beam collimation mechanisms and components, including, but not limited to optical lens, reflectors, mirrors, photonic integrated circuit (PIC) integrated lens, and the like.

Embodiments of the present description relate to the formation of integrated circuit packages having at least one optical via extending from a first surface of a package substrate to an opposing second surface of the package substrate. The at least one optical via creates an optical link between the opposing surfaces of the package substrate that enables the fabrication of a dual-sided optical multiple chip package, wherein integrated circuit devices can be attached to both surfaces of the package substrate for increased package density.

Figure 1:
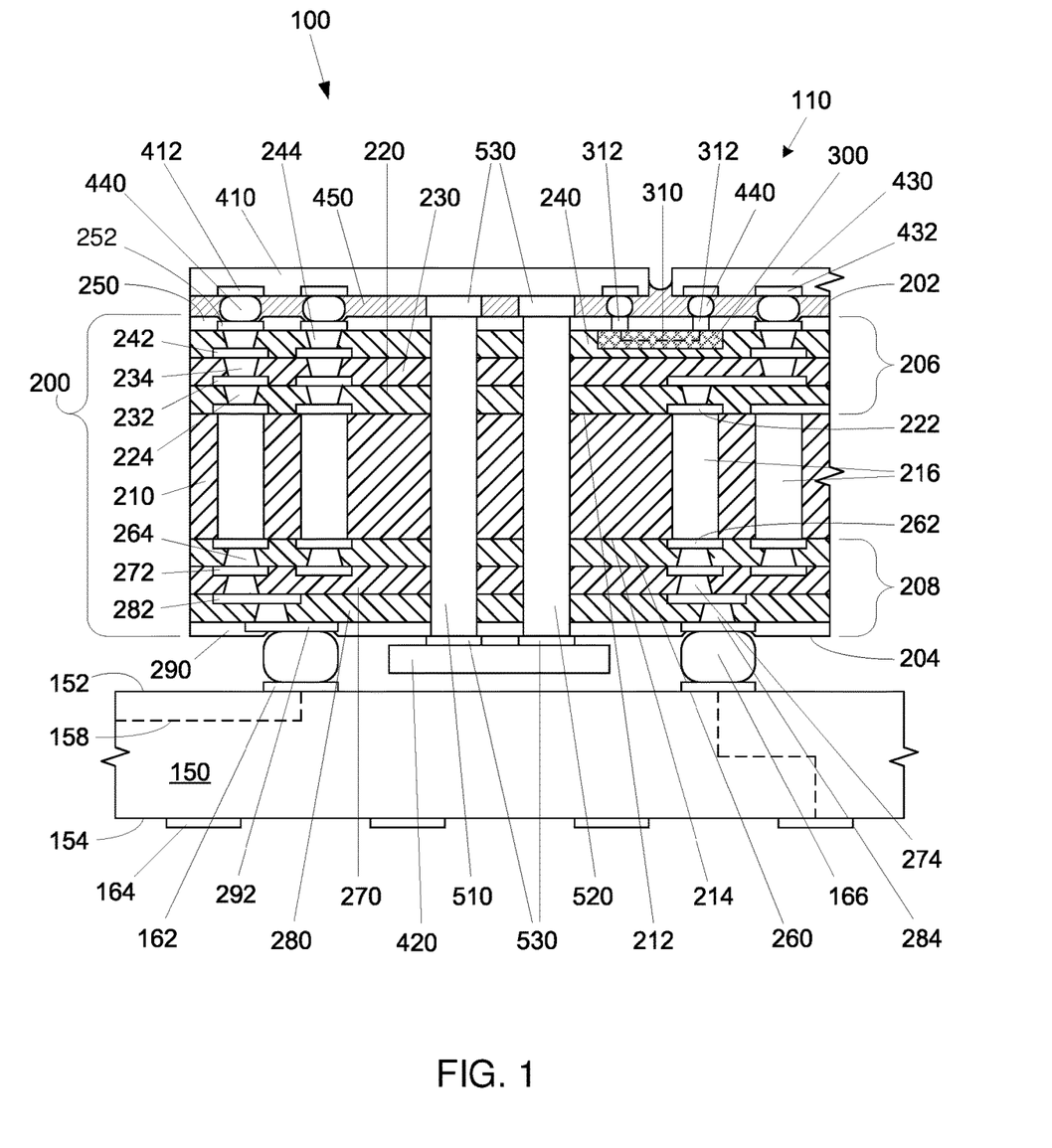
FIG. 1 is a side cross-sectional view of an integrated circuit assembly, according to one embodiment of the present description.

As shown in FIG. 1, an integrated circuit assembly 100 may be formed by electrically attaching an integrated circuit package 110 to an electronic board 150. The electronic board 150 may be any appropriate structure, including, but not limited to, an interposer, motherboard, or the like. The electronic board 150 may have a first surface 152 and an opposing second surface 154. The electronic board 150 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide materials, silica filled epoxy, glass reinforced epoxy material, and the like, as well as low-k and ultra low-k dielectrics (dielectric constants less than about 3.6), including but not limited to carbon doped dielectrics, fluorine doped dielectrics, porous dielectrics, organic polymeric dielectrics, and the like.

The electronic board 150 may further include conductive routes 158 or "metallization" (shown in dashed lines) extending through the electronic board 150. As will be understood to those skilled in the art, the conductive routes 158 may be a combination of conductive traces (not shown) and conductive vias (not shown) extending through the plurality of dielectric material layers (not shown). These conductive traces and conductive vias are well known in the art and are not shown in FIG. 1 for purposes of clarity. The conductive traces and the conductive vias may be made of any appropriate conductive material, including but not limited to, metals, such as copper, silver, nickel, gold, and aluminum, alloys thereof, and the like. As will be understood to those skilled in the art, the electronic board 150 may be a cored or coreless substrate. At least one of the conductive routes 158 may extend between a package connection bond pad 162 on or in the first surface 152 of the electronic board 150 and an external connection bond pad 164 on or in the second surface 154 of the electronic board 150 for attachment to external components (not shown). Additionally, at least one of the conductive routes 158 may be connected to other integrated circuit packages or devices (not shown) that are also electrically attached to the electronic board 150.

The integrated circuit package 110 may include a package substrate 200 having at least one integrated circuit device (shown as a first photonic integrated circuit device 410 and a package integrated circuit device 430) attached to a first surface 202 of the package substrate 200 and at least one integrated circuit device (shown as a second photonic integrated circuit device 420) attached to a second surface 204 of the package substrate 200. As will be understood to those skilled in the art, photonic integrated circuit devices, such as the first photonic integrated circuit device 410 and the second photonic integrated circuit device 420, are used to convert electrical signals to optical signals. As will be further understood, an optical cable(s) (not shown) may be coupled to at least one of the first photonic integrated circuit device 410 and the second photonic integrated circuit device 420.

As shown in FIG. 1, the package substrate 200 may comprise a core 210, having a first surface 212 and an opposing second surface 214, an upper routing structure 206 on the first surface 212 of the core 210, and a lower routing structure 208 on the second surface 214 of the core 210. The core 210 may be any substantially rigid material that assists in preventing warpage of the integrated circuit package 110 during operation. In one embodiment of the present description, the core 210 may include, but is not limited to, ceramics, glasses, woven glass fibers encased in resin, and the like. At least one conductive through-structure 216, such as a plated through-hole, may extend through the core 210 from the first surface 212 to the second surface 214 thereof.

The upper routing structure 206 may comprise a plurality of dielectric layers (shown as a first upper dielectric layer 220, a second upper dielectric layer 230, a third upper dielectric layer 240, and a fourth upper dielectric layer 250) having conductive routes formed from conductive traces (including bond pads) and conductive vias. The first upper dielectric layer 220, the second upper dielectric layer 230, the third upper dielectric layer 240, and the fourth upper dielectric layer 250 may comprise build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, as well as laminates or multiple layers thereof, and the like, as well as low-k and ultra low-k dielectrics (dielectric constants less than about 3.6), including, but not limited to, carbon doped dielectrics, fluorine doped dielectrics, porous dielectrics, organic polymetric dielectrics, and the like.

In one embodiment, the upper routing structure 206 may further comprise a plurality of first upper conductive traces 222 formed to be electrically attached with corresponding conductive through-structures 216 at the first surface 212 of the core 210, and may be electrically attached with corresponding first upper conductive vias 224 extending through the first upper dielectric layer 220. A plurality of second upper conductive traces 232 may be electrically attached to corresponding first upper conductive vias 224. A plurality of second upper conductive vias 234 may extend through the second upper dielectric layer 230 to electrically attach to corresponding second upper conductive traces 232. A plurality of third upper conductive traces 242 may electrically be attached with corresponding second upper conductive vias 234. A plurality of third upper conductive vias 244 may extend through the third upper dielectric layer 240 to electrically attach to corresponding third upper conductive traces 242. A plurality of fourth upper conductive traces 252 may be electrically attached with corresponding third upper conductive vias 244. The upper conductive traces/bond pads 222, 232, 242, and 252, and the upper conductive vias 224, 234, and 244 may be made of any appropriate conductive material, including, but not, limited to, metals, such as copper, silver, nickel, gold, aluminum, alloys thereof, and the like.

The lower routing structure 208 may comprise a plurality of dielectric layers (shown as a first lower dielectric layer 260, a second lower dielectric layer 270, a third lower dielectric layer 280, and a fourth lower dielectric layer 290) having conductive routes formed from conductive traces (including bond pads) and conductive vias. The first lower dielectric layer 260, the second lower dielectric layer 270, the third lower dielectric layer 280, and the fourth lower dielectric layer 290 may comprise build-up films and/or solder resist layers, and may be composed of an appropriate dielectric material, such as those discussed with regard to the upper routing structure 206.

In one embodiment, the lower routing structure 208 may further comprise a plurality of first lower conductive traces 262 formed to be electrically attached with corresponding conductive through-structures 216 at the second surface 214 of the core 210, and may be electrically attached with corresponding first lower conductive vias 264 extending through the first lower dielectric layer 260. A plurality of second lower conductive traces 272 may be electrically attached to corresponding first lower conductive vias 264. A plurality of second lower conductive vias 274 may extend through the second lower dielectric layer 270 to electrically attach to corresponding second lower conductive traces 272. A plurality of third lower conductive traces 282 may be electrically attached with corresponding second lower conductive vias 274. A plurality of third lower conductive vias 284 may extend through the third lower dielectric layer 280 to electrically attach to corresponding third lower conductive traces 282. A plurality of fourth lower conductive traces 292 may be electrically attached with corresponding third lower conductive vias 284. The tower conductive traces/ bond pads 262, 272, 282, and 292, and the lower conductive vias 264, 274, and 284 may be made of any appropriate conductive material, including, but not limited to, metals, such as copper, silver, nickel, gold, aluminum, alloys thereof, and the like.

The integrated circuit package 110 may be attached to the electronic board 150 through a plurality of package-to-carrier substrate interconnects 166, such as a solder material, extending between the fourth lower conductive traces 292 (bond pads) of the package substrate 200 and the package connection bond pad 162 of the electronic board 150.

As further shown in FIG. 1, the first photonic integrated circuit device 410 and the package integrated circuit device 430 may be electrically attached to the package substrate 200 at the first surface 202 thereof. The first photonic integrated circuit device 410 may be any appropriate photonic device, and the package integrated circuit device 430 may be any appropriate device, including, but not limited to, an input/output control hub (such as an electronic integrated chip), a microprocessor, a chipset, a graphics device, a wireless device, a memory device, an application specific integrated circuit device, combinations thereof, stacks thereof, and the like. The first photonic integrated circuit device 410 and the package integrated circuit device 430 may be attached to the package substrate 200 through a plurality of device-substrate interconnects 440, such as reflowable solder bumps or balls, in a configuration generally known as a flip-chip or controlled collapse chip connection ("C4") configuration. The device-to-substrate interconnects 440 may extend between bond pads 412 of the first photonic integrated circuit device 410 and corresponding fourth upper conductive traces 252 (bond pad) of the package substrate 200, and between bond pads 432 of the package integrated circuit device 430 and corresponding fourth upper conductive traces 252 (bond pad) of the package substrate 200. It is understood that the first photonic integrated circuit device bond pads 412 may be in electrical communication with integrated circuitry (not shown) within the first photonic integrated circuit device 410, and that the package integrated circuit device bond pads 432 may be in a electrical communication with integrated circuitry (not shown) within the package integrated circuit device 430.

In one embodiment, at least one bridge 300 may electrically couple the first photonic integrated circuit device 410 and the package integrated circuit device 430. As shown in FIG. 1, the bridge 300 may be at least partially encapsulated within the third upper dielectric layer 240. In an embodiment, a plurality of conductive pillars 312 may extend through the fourth upper dielectric layer 250. The bridge 300 may create an electrical signal connection between the first photonic integrated circuit device 410 and the package integrated circuit device 430 with the at least one device-to-device interconnection route 310 (shown as a dashed line) extending between one conductive pillar 312 of the bridge 300 that is electrically attached to the first photonic integrated circuit device 410 with at least one device-to-substrate interconnect 440 and another conductive pillar 312 of the bridge 300 that is electrically attached to the package integrated circuit device 430 with at least one device-to-substrate interconnect 440.

In one embodiment, the bridge 300 may comprise silicon-containing components. As will be understood to those skilled in the art, silicon bridges may be preferred because silicon processing technology is relatively advanced, and interconnect pitches and line widths for the device-to-device interconnection route 310 that are achievable using existing silicon process technology may be significantly smaller, and thus more dense, than what is possible using, for example, currently available technology for copper signal lines in polymer layers, as is common in package substrate fabrication.

In another embodiment, the bridge 300 may be an optical bridge, which may optically couple the first photonic integrated circuit device 410 and the package integrated circuit device 430.

The device-to-substrate interconnects 440 may be any appropriate electrically conductive material or structure, including but not limited to, solder balls, metal bumps or pillars, metal filled epoxies, or a combination thereof. In one embodiment, the device-to-substrate interconnects 440 may be solder balls formed from tin, lead/tin alloys (for example, 63% tin/37% lead solder), and high tin content alloys (e.g., 90% or more tin—such as tin/bismuth, eutectic tin/silver, ternary tin/silver/copper, eutectic tin/copper, and similar alloys). In another embodiment, the device-to-substrate interconnects 440 may be copper bumps or pillars. In a further embodiment, the device-to-substrate interconnects 440 may be metal bumps or pillars coated with a solder material.

In one embodiment, an underfill material 450, such as an epoxy material, may be disposed between the package substrate 200 and the integrated circuit devices 410 and 430, and surrounding the plurality of device-to-substrate interconnects 440. As will be understood to those skilled in the art, the underfill material 450 may be dispensed as a viscous liquid and then hardened with a curing process. The underfill material 450 may also be a molded underfill material. The underfill material 450 may provide structural integrity and may prevent contamination, as will be understood to those skilled in the art.

As further shown in FIG. 1 the second photonic integrated circuit device 420 may be attached to the second surface 204 of the package substrate 200. The first photonic integrated circuit device 410 may be optically connected to the second photonic integrated circuit device 420 with at least one optical via, illustrated as a first optical via 510 and a second optical via 520. It is noted that optical couplers 530 may extend between the first photonic integrated circuit device 410 and the first optical via 510 and the second optical via 520 and the second photonic integrated circuit device 420 and the first optical via 510 and the second optical via 520. In one embodiment, at least one the first photonic integrated circuit device 410 and photonic integrated circuit device 420 may include any appropriate semiconductor-based light sources ("transmitter"), including, but not limited to, light-emitting diodes, super-luminescent diodes, lasers, single photo emitter, and the like. In a further embodiment, at least one the first photonic integrated circuit device 410 and the photonic integrated circuit device 420 may include any appropriate semiconductor-based photodetector ("receiver"), including, but not limited to those based on the detection of thermal, chemical, quantum, photoelectric, and like effects. In an embodiment of the present description, the first photonic integrated circuit device 410 may transmit optical signals to the second photonic integrated circuit device 420 through the first optical via 510 and may receive optical signals from the second photonic integrated circuit device 420 through the second optical via 520. In one embodiment, when the light source is a laser or focus with a lens, at least one of the first optical via 510 and the second optical via 520 may be an unfilled opening or a filled opening. When the first optical via 510 and/or the second optical via 520 is a filled opening, a transparent material may be utilized. In another embodiment, at least one of the first optical via 510 and the second optical via 520 may be a waveguide, such as a light pipe, an optical fiber, and the like.

Figure 2:
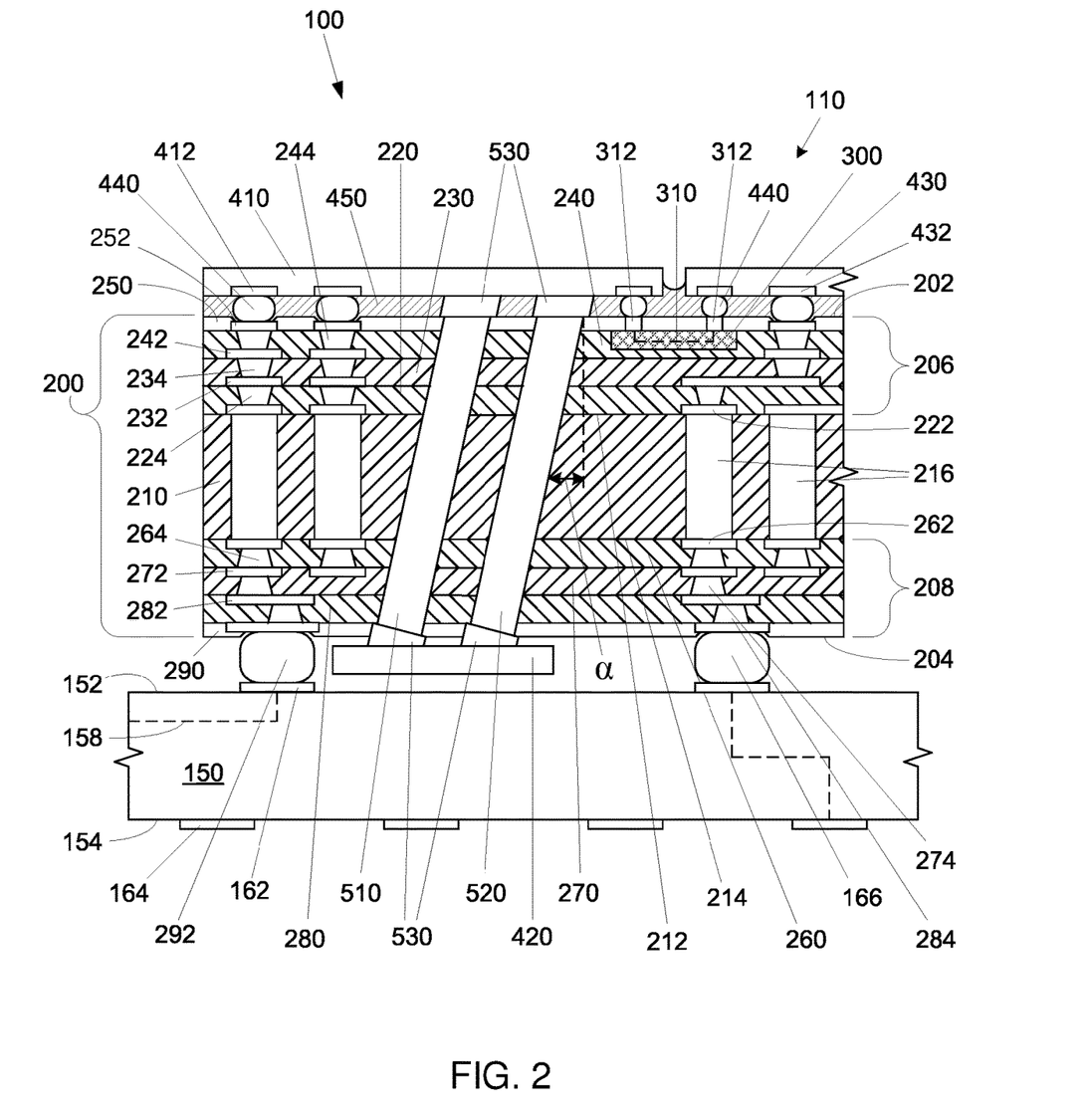
FIG. 2 is a side cross-sectional view of an integrated circuit assembly, according to another embodiment of the present description.

The first optical via 510 and the second optical via 520 are illustrated as being substantially perpendicular (i.e., 90 degrees, plus or minus 5 degrees) to the first surface 202 and the second surface 204 of the package substrate 200, which positions the first optical via 510 and the second optical via 520 substantially parallel to the direction of photon travel to and/or from the first photonic integrated circuit device 410 and/or the second photonic integrated circuit device 420. However, the embodiments of the present description are not so limited. In an embodiment hereof, as shown in FIG. 2, the first optical via 510 and the second optical via 520 may be angled. As will be understood to those skilled in the art, placing the first optical via 510 and the second optical via 520 at an angle may achieve improved optical coupling between transmitter/receiver of the photonic integrated circuit devices 410, 420 and the optical vias 510, 520, due to diminished photon scattering. In one embodiment of the present description, the first optical via 510 and the second optical via 520 may have an angle α of between about 7 and 45 degrees from the second surface 204 of the package substrate 200. In a specific embodiment of the present description, the first optical via 510 and the second optical via 520 may have an angle α of between about 7 and 15 degrees from the second surface 204 of the package substrate 200.

It is understood that at least one first surface thermal solution (not shown), such as an integrated heat spreader, a heat sink, a heat pipe, a thermal electric cooler, and the like, may be thermally coupled to any integrated circuit devices on the first surface 202 of the package substrate 200 and at least one second surface thermal solution (not shown), which is independent from the at least one first surface thermal solution, may be thermally coupled to any integrated circuit devices on the second surface 204 of the package substrate 200. Having separate, independent thermal solutions will improve the thermal performance and eliminate thermal cross-talk.

Figure 3:
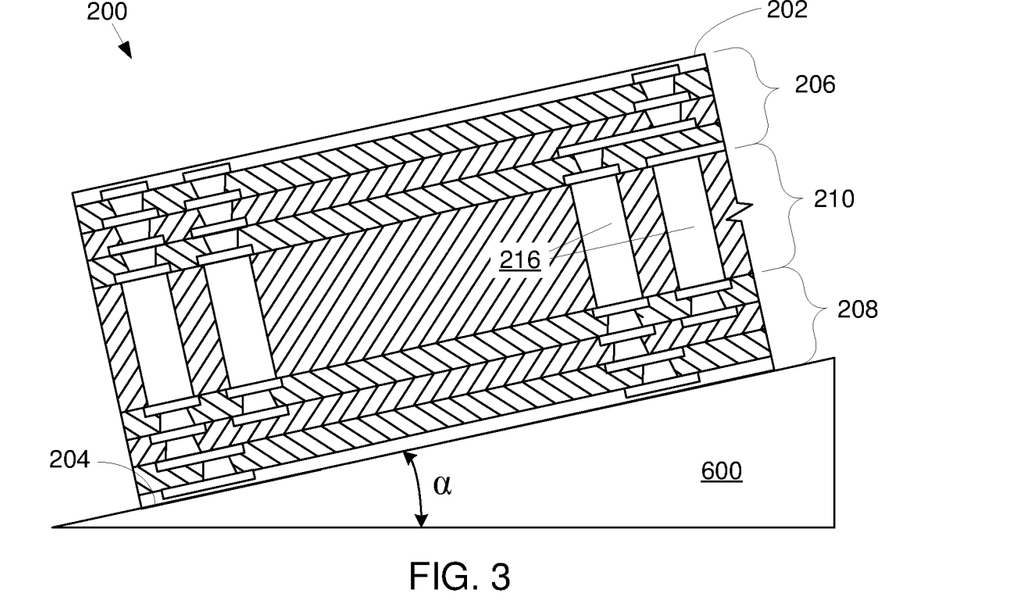
FIGS. 3-9 are side cross-sectional views of a process for fabrication of a package substrate having at least one optical via, according to an embodiment of the present description.

FIGS. 3-9 illustrate side cross-sectional views of a process of fabricating the optical vias 510, 520 of the package substrate 200, according to embodiments of the present description. As shown in FIG. 3, the package substrate 200 may be positioned on a "dummy board" 600 that tilts the package substrate 200 at the angle α of the desired angle for the optical vias to be formed. The processes of fabricating the package substrate 200, prior to the formation of the optical vias 510, 520 (see FIG. 2), is well known in the art and for the purposes of clarity and conciseness will not be described herein.

Figure 4:
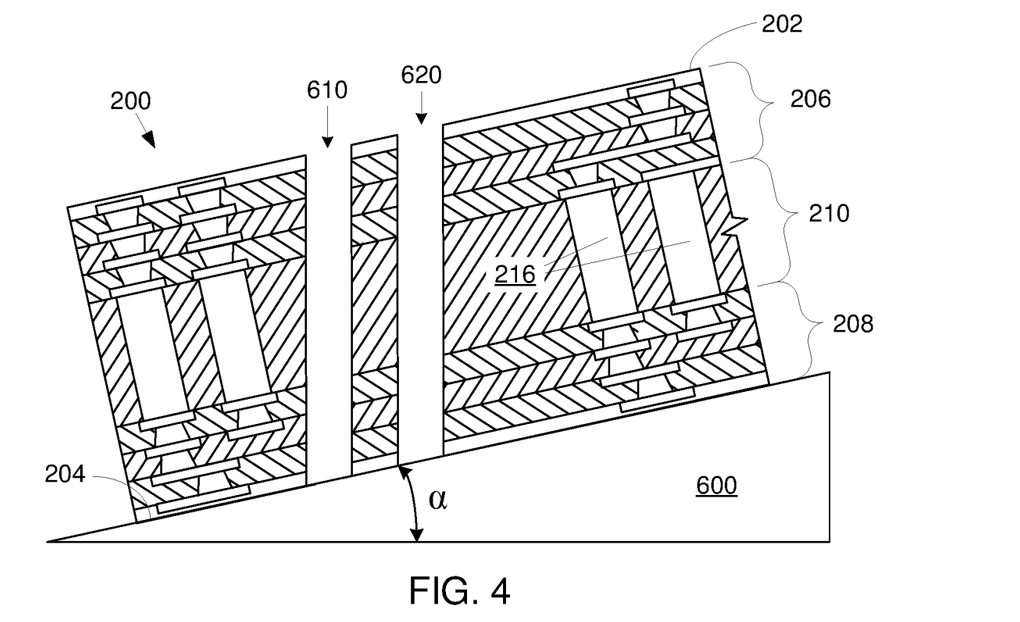
Figure 5:
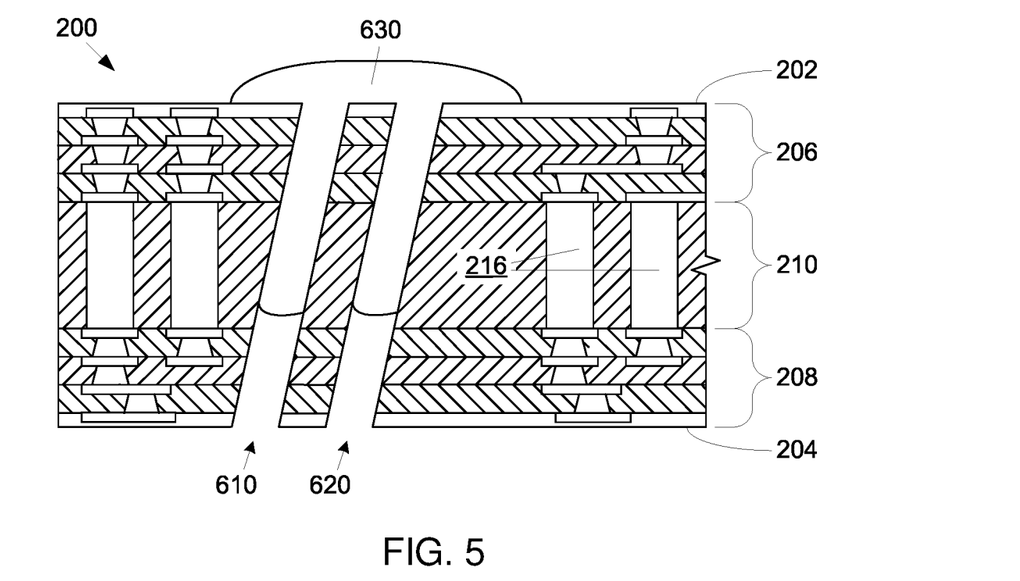

As shown in FIG. 4, at least one primary opening (shown as a first primary opening 610 and a second primary opening 620) may be formed, such as by drilling, through the package substrate 200 from the first surface 202 to the second surface 204 thereof. As shown in FIG. 5, the package substrate 200 may be removed from the dummy board 600, and a first optical material 630 may be deposited in the first primary opening 610 and the second primary opening 620, such as by depositing the first optical material 630 on the first surface 202 of the package substrate 200 and placing a pressure differential on the second surface 204 of the package substrate 200 to draw the first optical material 630 into the first primary opening 610 and the second primary opening 620, as shown.

Figure 6:
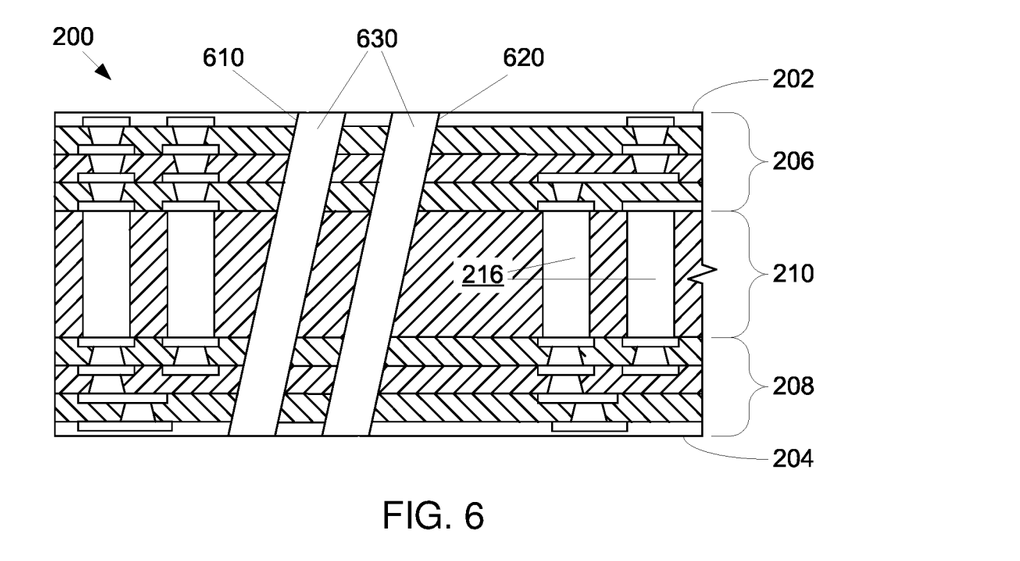
Figure 7:
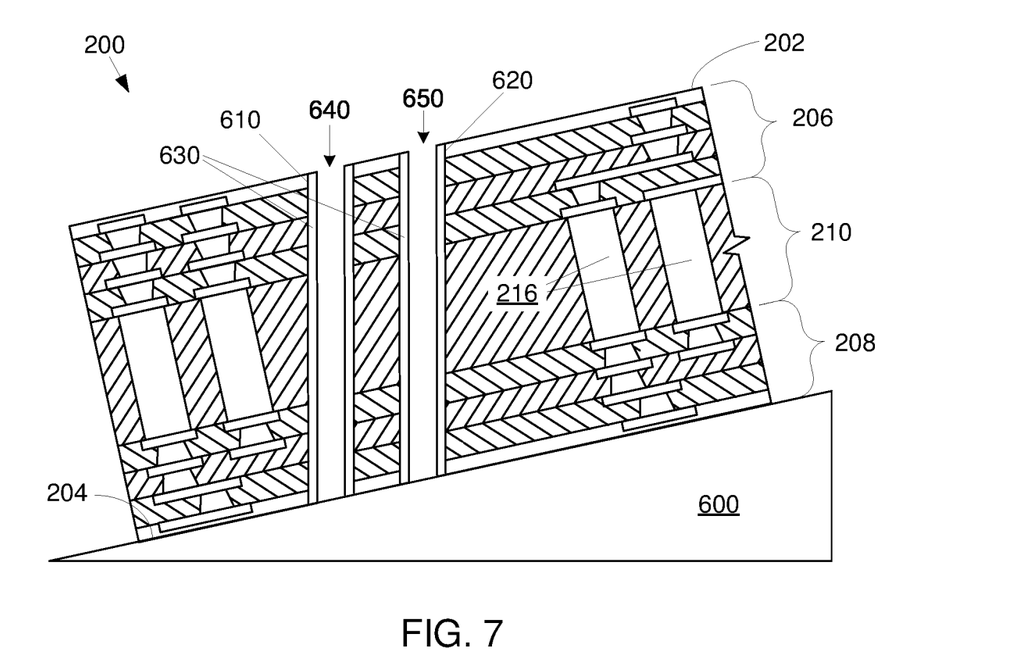
Figure 8:
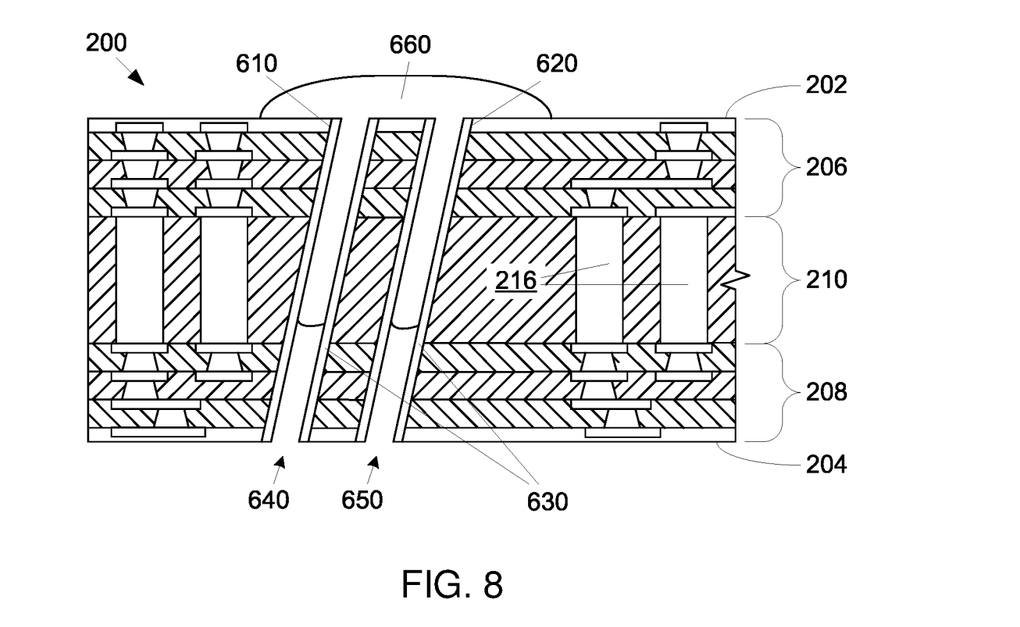
Figure 9:
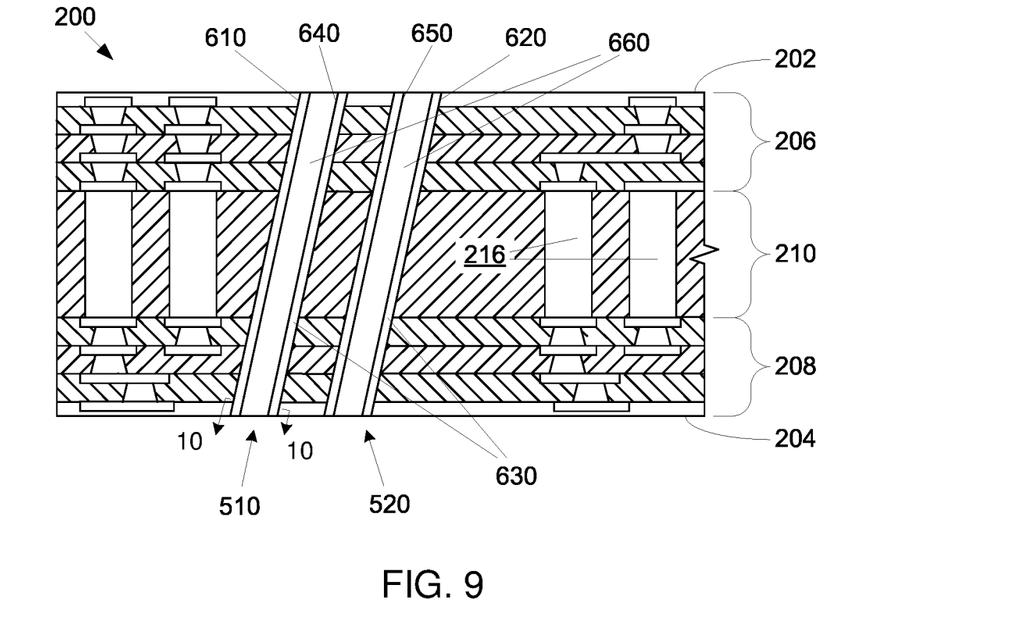

As shown in FIG. 6, the first optical material 630 may be cured, if necessary, and planarized. As shown in FIG. 7, the package substrate 200 may again be positioned on the dummy board 600 and at least one secondary opening (shown as a first secondary opening 640 and a second secondary opening 650) may be formed within the first optical material 630 in the first primary opening 610 and within the first optical material 630 in the second primary opening 620, respectively, such as by drilling, from the first surface 202 to the second surface 204 of the package substrate 200. As shown in FIG. 8, the package substrate 200 may be removed from the dummy board 600, and a second optical material 660 may be deposited in the first secondary opening 640 and the second secondary opening 650, such as by depositing the second optical material 660 on the first surface 202 of the package substrate 200 and placing a pressure differential on the second surface 204 of the package substrate 200 to draw the second optical material 660 into the first secondary opening 640 and the second secondary opening 650, as shown. As shown in FIG. 9, the first optical material 630 may be cured, if necessary, and planarized to form the first optical via 510 and the second optical via 520.

Figure 10:
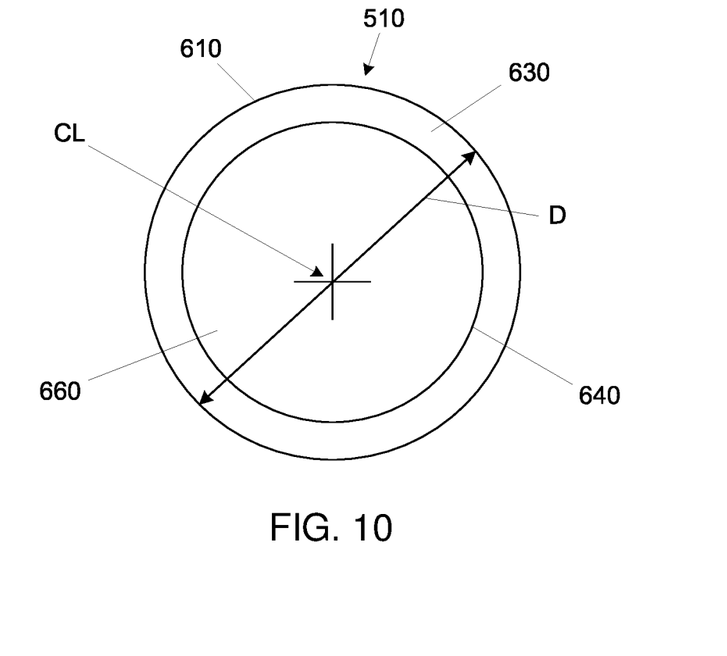
FIG. 10 is a side cross-sectional view along line 10-10 of FIG. 9, according to an embodiment of the present description.

FIG. 10 illustrates a cross-sectional view along line 10-10 of FIG. 9. In one embodiment of the present description, the second optical material 660 may be substantially concentric to the first optical material 630 along a center line CL (extends perpendicular out of the figure and marked with a cross "+"). The process of FIGS. 2-10 essentially forms coaxial waveguides for the first optical via 510 and the second optical via 520. In one embodiment of the present description, the first optical material 630 and the second optical material 660 may comprise a polymer material, including, but not limited to an epoxy-based polymer, wherein an index of refraction of the first optical material 630 is lower than an index of refraction of the second optical material 660, such that the first optical material 630 will act as a cladding. As will be understood to those skilled in the art, the index contrast between the first optical material 630 and the second optical material 660 permits the confinement of optical signals. In one embodiment of the present description, the first optical via 510 and/or the second optical via 520 may have a diameter D (see FIG. 10) of between about 400 microns and 2.1 millimeters, which allows for flexibility in design.

Although FIGS. 3-9 illustrate the fabrication of angled optical vias 510, 520, it is understood that non-angled optical vias 510, 520, such as shown in FIG. 1, can be fabricated in the same manner by eliminating the use of the dummy board 600 (see FIG. 3). Furthermore, in another embodiment of the present description, after the formation of the first primary opening 610 and the second primary opening 620 in FIG. 6, prefabricated coaxial waveguide fibers could be inserted into the first primary opening 610 and the second primary opening 620 to form the first optical via 510 and the second optical via 520, respectively, as shown in FIG. 9.

Figure 11:
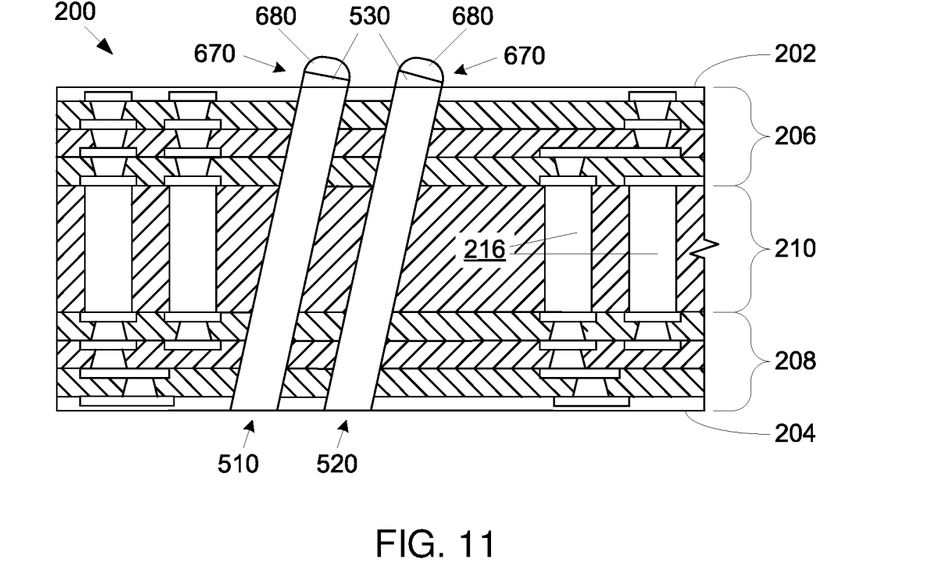
FIGS. 11 and 12 are side cross-sectional views of a package substrate having at least one optical via with a lensed configuration, according to embodiments of the present description.
Figure 12:
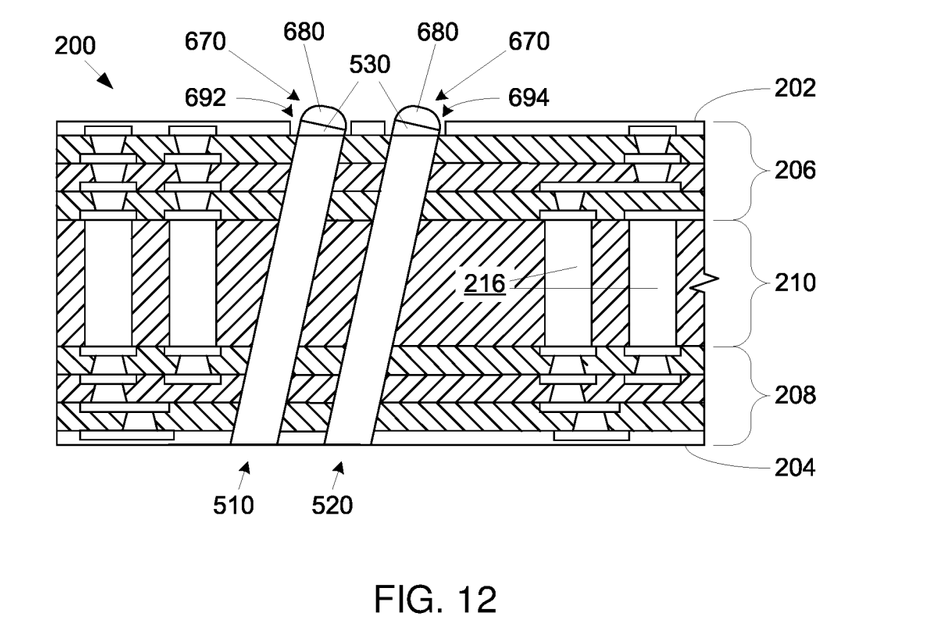

As will be understood to those skilled in the art, if a lensed embodiment is utilized for photon transmission, the process described above may be stopped after the formation of the first primary opening 610 and the second primary opening 620, or when a single optical material is needed with a lensed embodiment, the process described above may be stopped after the planarization of the first optical material 630 in FIG. 6. The latter embodiment is shown in FIGS. 11 and 12. As shown into FIG. 11, the first optical via 510 and the second optical via 520 may comprise a single optical material (e.g., the first optical material 630) extending through the package substrate 200. A lens assembly 670, comprising the optical coupler 530 and a lens 680 mounted to the optical coupler 530, may be attached to each of the first optical via 510 and the second optical via 520. In another embodiment of the present description, as shown in FIG. 12, a portion of the first optical via 510 and a portion of the upper routing structure 206 adjacent the first optical via 510 may be removed to form a first recess 692, and a portion of the second optical via 520 and a portion of the upper routing structure 206 adjacent the second optical via 520 may be removed to form a second recess 694. The first recess 692 and the second recess 694 may be used to self-align the lens assemblies 670 for attachment thereof to the first optical via 510 and the second optical via 520, respectively.

Figure 13:
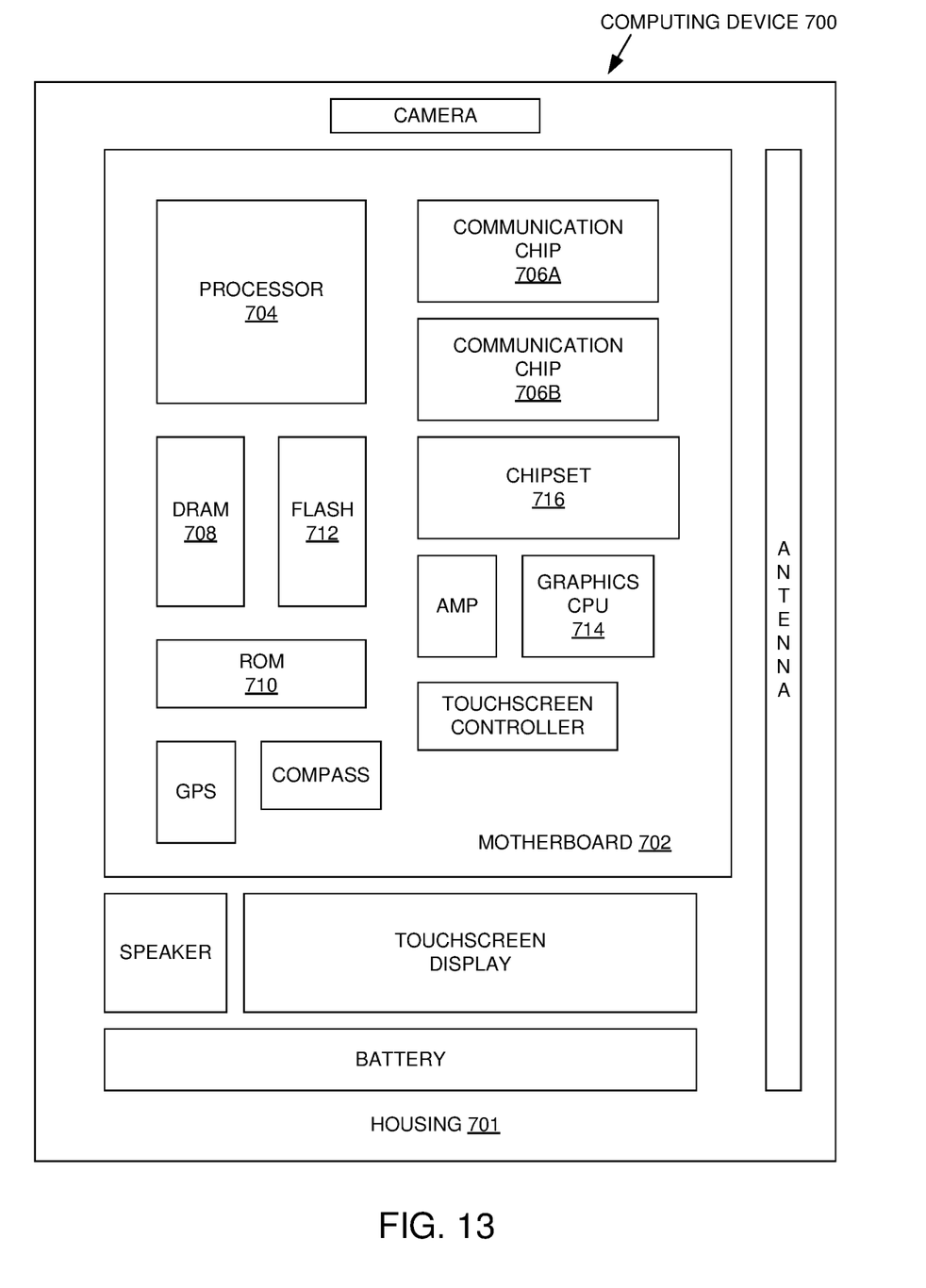
FIG. 13 is an electronic system, according to one embodiment of the present description.

FIG. 13 illustrates an electronic or computing device 700 in accordance with one implementation of the present description. The computing device 700 may include a housing 701 having a board 702 disposed therein. The computing device 700 may include a number of integrated circuit components, including but not limited to a processor 704, at least one communication chip 706A, 706B, volatile memory 708 (e.g., DRAM), non-volatile memory 710 (e.g., ROM), flash memory 712, a graphics processor or CPU 714, a digital signal processor (not shown), a crypto processor (not shown), a chipset 716, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 702. In some implementations, at least one of the integrated circuit components may be a part of the processor 704.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit package, which comprises a package substrate having a first surface and an opposing second surface, an optical via within the package substrate, wherein the optical via extends from the first surface of the package substrate to the second surface of the package substrate, a first photonic integrated circuit device attached to the first surface of the package substrate, wherein the first photonic integrated circuit device is optically coupled to the optical via, and a second photonic integrated circuit device attached to the second surface of the package substrate, wherein the second photonic integrated circuit device is optically coupled to the optical via.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-13. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an apparatus comprising a package substrate having a first surface and an opposing second surface; an optical via within the package substrate, wherein the optical via extends from the first surface of the package substrate to the second surface of the package substrate; a first photonic integrated circuit device attached to the first surface of the package substrate, wherein the first photonic integrated circuit device is optically coupled to the optical via; and a second photonic integrated circuit device attached to the second surface of the package substrate, wherein the second photonic integrated circuit device is optically coupled to the optical via.

In Example 2, the subject matter of Example 1 can optionally include the optical via being substantially perpendicular to the first surface and second surface of the package substrate.

In Example 3, the subject matter of Example 1 can optionally include the optical via being angled off of perpendicular to the first surface and second surface of the package substrate between about 7 and 45 degrees.

In Example 4, the subject matter of any of Examples 1 to 3 can optionally include the optical via comprising a waveguide.

In Example 5, the subject matter of any of Examples 1 to 4 can optionally include a lens assembly adjacent the first surface of the package substrate.

Example 6 is a system, comprising an electronic board and an integrated circuit package electrically attached to the electronic board, wherein the integrated circuit package comprises a package substrate having a first surface and an opposing second surface; an optical via within the package substrate, wherein the optical via extends from the first surface of the package substrate to the second surface of the package substrate; a first photonic integrated circuit device attached to the first surface of the package substrate, wherein the first photonic integrated circuit device is optically coupled to the optical via; and a second photonic integrated circuit device attached to the second surface of the package substrate, wherein the second photonic integrated circuit device is optically coupled to the optical via.

In Example 7, the subject matter of Example 6 can optionally include the optical via being substantially perpendicular to the first surface of the package substrate and to the second surface of the package substrate.

In Example 8, the subject matter of Example 6 can optionally include the optical via being angled off of perpendicular to the first surface and second surface of the package substrate between about 7 and 45 degrees.

In Example 9, the subject matter of any of Examples 6 to 8 can optionally include the optical via comprising a waveguide.

In Example 10, the subject matter of any of Examples 6 to 9 can optionally include a lens assembly adjacent the first surface of the package substrate.

In Example 11, the subject matter of any of Examples 6 to 10 can optionally include at least one package integrated circuit device electrically attached to the first surface of the package substrate.

In Example 12, the subject matter of Example 11 can optionally include the at least one package integrated circuit device being optically coupled to the first photonic integrated circuit device with a bridge at least partially embedded in the package substrate.

In Example 13, the subject matter of Example 11 can optionally include the at least one package integrated circuit device being electrically coupled to the first photonic integrated circuit device with a bridge at least partially embedded in the package substrate.

Example 14 is a method comprising forming a package substrate having a first surface and an opposing second surface; forming an optical via within the package substrate, wherein the optical via extends from the first surface of the package substrate to the second surface of the package substrate; attaching a first photonic integrated circuit device to the first surface of the package substrate, wherein the first photonic integrated circuit device is optically coupled to the optical via; and attaching a second photonic integrated circuit device to the second surface of the package substrate, wherein the second photonic integrated circuit device is optically coupled to the optical via.

In Example 15, the subject matter of Example 14 can optionally include forming the optical via to be substantially perpendicular to the first surface of the package substrate and to the second surface of the package substrate.

In Example 16, the subject matter of Example 1 can optionally include forming the optical via to be angled off of perpendicular to the first surface and second surface of the package substrate between about 7 and 45 degrees.

In Example 17, the subject matter of any of Examples 14 to 16 can optionally include forming the optical via comprising forming a waveguide.

In Example 18, the subject matter of Example 17 can optionally include forming the waveguide comprising forming a primary opening in the package substrate, wherein the primary opening extends from the first surface of the package substrate to the second surface of the package substrate; filling the primary opening with a first optical material; forming a secondary opening in the first optical material, wherein the secondary opening extends from the first surface of the package substrate to the second surface of the package substrate; and filling the secondary opening with a second optical material, wherein an index of refraction of the first optical material is lower than an index of refraction of the second optical material.

In Example 19, the subject matter of Example 18 can optionally include forming the secondary opening substantially concentrically to the primary opening.

In Example 20, the subject matter of any of Examples 14 to 19 can optionally include forming a lens assembly adjacent the first surface of the package substrate.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
   a package substrate having a first surface and an opposing second surface, parallel to the first surface;
   an optical via within the package substrate, wherein the optical via extends from the first surface of the package substrate to the second surface of the package substrate at an angle off of perpendicular from the first surface and second surface of the package substrate by between 7 and 45 degrees;
   a first photonic integrated circuit device attached to the first surface of the package substrate, wherein the first photonic integrated circuit device is optically coupled to the optical via; and
   a second photonic integrated circuit device attached to the second surface of the package substrate, wherein the second photonic integrated circuit device is optically coupled to the optical via.

2. The apparatus of claim 1, wherein, the package substrate comprises:
   a core;
   at least one electrically conductive through-structure passing through a thickness of the core;
   a first routing structure having first conductive routes over the first surface and electrically coupled to the through-structure; and
   a second routing structure having second electrically conductive routes over the second surface and electrically coupled to the through-structure.

3. The apparatus of claim 2, wherein:
   the first routing structure terminates at first bond pads attached to the first photonic integrated circuit device; and
   the second routing structure terminates at second bond pads.

4. The apparatus of claim 1, wherein the optical via comprises a waveguide further comprising a first optical material of lower refractive index surrounding a second optical material of higher refractive index within an opening through the substrate.

5. The apparatus of claim 1, further comprising a lens assembly adjacent the first surface of the package substrate, wherein the lens assembly comprises an optical coupler and a lens mounted to the optical coupler and wherein the first photonic integrated circuit device is optically coupled to the optical via by the lens assembly.

6. A system, comprising:
an electronic board; and
an integrated circuit package electrically attached to the electronic board, wherein the integrated circuit package comprises:
a package substrate having a first surface and an opposing second surface, parallel to the first surface;
an optical via within the package substrate, wherein the optical via extends from the first surface of the package substrate to the second surface of the package substrate at an angle off of perpendicular from the first surface and second surface of the package substrate by between 7 and 45 degrees;
a first photonic integrated circuit device attached to the first surface of the package substrate, wherein the first photonic integrated circuit device is optically coupled to the optical via; and
a second photonic integrated circuit device attached to the second surface of the package substrate, wherein the second photonic integrated circuit device is optically coupled to the optical via.

7. The system of claim 6, wherein, the substrate comprises:
a core;
at least one electrically conductive through-structure passing through a thickness of the core;
a first routing structure having first conductive routes over the first surface and electrically coupled to the through-structure; and
a second routing structure having second electrically conductive routes over the second surface and electrically coupled to the through-structure.

8. The system of claim 7, wherein:
the first routing structure terminates at first bond pads attached to the first photonic integrated circuit device; and
the second routing structure terminates at second bond pads.

9. The system of claim 6, wherein the optical via comprises a waveguide further comprising a first optical material of lower refractive index surrounding a second optical material of higher refractive index within an opening through the substrate.

10. The system of claim 6, further comprising a lens assembly adjacent the first surface of the package substrate, wherein the lens assembly comprises an optical coupler and a lens mounted to the optical coupler and wherein the first photonic integrated circuit device is optically coupled to the optical via by the lens assembly.

11. The system of claim 6, further comprising at least one package integrated circuit device electrically attached to the first surface of the package substrate.

12. The system of claim 11, wherein the optical via is one of a plurality of optical vias coupling the first photonic integrated circuit device to the second photonic integrated circuit device, the plurality of optical vias having substantially the same angle off of perpendicular from the first and second surfaces.

13. The system of claim 11, wherein the at least one package integrated circuit device is electrically coupled to the first photonic integrated circuit device with a bridge at least partially embedded in the package substrate.

14. A method, comprising:
receiving a package substrate having a first surface and an opposing second surface, parallel to the first surface;
drilling an opening within the package substrate from the first surface of the package substrate to the second surface of the package substrate at an angle off of perpendicular from the first and second surfaces by between 7 and 45 degrees;
forming an optical via within the opening;
attaching a first photonic integrated circuit device to the first surface of the package substrate, wherein the first photonic integrated circuit device is optically coupled to the optical via; and
attaching a second photonic integrated circuit device to the second surface of the package substrate, wherein the second photonic integrated circuit device is optically coupled to the optical via.

15. The method of claim 14, wherein the package substrate comprises:
a core;
at least one electrically conductive through-structure passing through a thickness of the core;
a first routing structure having first conductive routes over the first surface and electrically coupled to the through-structure; and
a second routing structure having second electrically conductive routes over the second surface and electrically coupled to the through-structure.

16. The method of claim 15, wherein:
the first routing structure terminates at first bond pads attached to the first photonic integrated circuit device; and
the second routing structure terminates at second bond pads.

17. The method of claim 14, wherein forming the optical via comprises placing an optical fiber in the opening.

18. The method of claim 14, wherein forming the optical via comprises:
filling the opening with a first optical material;
forming a secondary opening in the first optical material, wherein the secondary opening extends from the first surface of the package substrate to the second surface of the package substrate; and
filling the secondary opening with a second optical material, wherein an index of refraction of the first optical material is lower than an index of refraction of the second optical material.

19. The method of claim 18, wherein forming the secondary opening comprises forming the secondary opening substantially concentrically to the opening.

20. The method of claim 14, further comprising forming a lens assembly adjacent the first surface of the package substrate, wherein forming the lens assembly comprises mounting an optical coupler and a lens to the optical coupler.

* * * * *